United States Patent
Ngai et al.

(10) Patent No.: US 8,237,195 B2
(45) Date of Patent: Aug. 7, 2012

(54) POWER MOSFET HAVING A STRAINED CHANNEL IN A SEMICONDUCTOR HETEROSTRUCTURE ON METAL SUBSTRATE

(75) Inventors: Tat Ngai, Austin, TX (US); Qi Wang, Sandy, UT (US); Joelle Sharp, Herriiman, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 321 days.

(21) Appl. No.: 12/248,874

(22) Filed: Oct. 9, 2008

(65) Prior Publication Data
US 2010/0078682 A1    Apr. 1, 2010

Related U.S. Application Data

(60) Provisional application No. 61/101,116, filed on Sep. 29, 2008.

(51) Int. Cl.
*H01L 29/66* (2006.01)
(52) U.S. Cl. . 257/192; 257/330; 257/331; 257/E21.419; 257/E21.42
(58) Field of Classification Search .......... 257/341–342, 257/401, E21.419–E21.42, E29.26, 330–331, 257/192
See application file for complete search history.

(56) References Cited

U.S. PATENT DOCUMENTS

| | | | |
|---|---|---|---|
| 6,429,481 B1 | 8/2002 | Mo et al. | |
| 2004/0173846 A1 | 9/2004 | Hergenrother et al. | |
| 2006/0076617 A1* | 4/2006 | Shenoy et al. | 257/333 |
| 2006/0157687 A1 | 7/2006 | Doyle et al. | |
| 2006/0267090 A1* | 11/2006 | Sapp et al. | 257/341 |
| 2006/0289916 A1 | 12/2006 | Park et al. | |
| 2007/0020884 A1* | 1/2007 | Wang et al. | 438/455 |
| 2007/0235886 A1 | 10/2007 | Yilmaz et al. | |

(Continued)

FOREIGN PATENT DOCUMENTS

CN        101185169 A    5/2008

(Continued)

OTHER PUBLICATIONS

Cheng, Zhi-Yuan et al., "Electron Mobility Enhancement in Strained-Si n-MOSFETs Fabricated on SiGe-on-Insulator (SGOI) Substrates," Jul. 2001, *IEEE Electron Device Letters*, vol. 22, No. 7, pp. 321-323.

(Continued)

*Primary Examiner* — Matthew Landau
*Assistant Examiner* — Daniel Luke
(74) *Attorney, Agent, or Firm* — Kilpatrick Townsend & Stockton, LLP

(57) ABSTRACT

A field effect transistor device having a strained semiconductor channel region overlying a heterostructure-semiconductor on a metal substrate includes a first semiconductor layer overlying a first metal layer. The first semiconductor layer has a first semiconductor material and a second semiconductor material in a relaxed heterostructure and is heavily doped. A second semiconductor layer overlies the first semiconductor layer and has a first semiconductor material and a second semiconductor material in a relaxed heterostructure. The second semiconductor layer is more lightly doped than the first semiconductor layer. A trench extends into the second semiconductor layer and a channel region has a strained layer of the first semiconductor material adjacent a trench sidewall. The strained channel region provides enhanced carrier mobility and improves performance of the field effect transistor.

22 Claims, 15 Drawing Sheets

U.S. PATENT DOCUMENTS

2007/0238263 A1 10/2007 Yilmaz et al.
2008/0048258 A1 2/2008 Fresart et al.

FOREIGN PATENT DOCUMENTS

CN    101233603 A    7/2008

OTHER PUBLICATIONS

Fitzgerald, E.A. et al., "Totally Relaxed $Ge_xSi_{1-x}$ Layers with Low Threading Dislocation Densities Grown on Si Substrates," Aug. 12, 1991, *Applied Physics*, vol. 59, No. 7, pp. 811-813.

International Search Report of the International Searching Authority for Application No. PCT/US2009/058458, mailed on Apr. 28, 2010, 3 pages.

Written Opinion of the International Searching Authority for Application No. PCT/US2009/058458, mailed on Apr. 28, 2010, 3 pages.

China State Intellectual Property Office office action for patent application 200980138320.0 (Mar. 12, 2012).

\* cited by examiner

POWER MOSFET HAVING A STRAINED CHANNEL IN A SEMICONDUCTOR HETEROSTRUCTURE ON METAL SUBSTRATE

This application claims the benefit of U.S. provisional application No. 61/101,116 filed Sep. 29, 2008, which is incorporated by reference herein in its entirety for all purposes.

BACKGROUND OF THE INVENTION

The present invention relates generally to power transistors, and more specifically to metal-oxide-semiconductor-gated (MOS-gated) power transistors with strained semiconductor channel regions in a semiconductor heterostructure on a metal substrate.

Conventional semiconductor manufacturing utilizes a number of processes to form semiconductor structures on substrates. In certain devices, the substrate is used as part of the current conduction path. For example, the substrate plays an important role with the solid state switch which is a key semiconductor structure used for discrete device applications and integrated circuits. Solid state switches include, for example, the power metal-oxide-semiconductor field effect transistor (power MOSFET), the insulated-gate bipolar transistor (IGBT), and various types of thyristors. Some of the defining performance characteristics for the power switch are its on-resistance (i.e., drain-to-source on-resistance, $R_{DSon}$), breakdown voltage, and switching speed.

Generally, device properties such as the switching speed, on-resistance, breakdown voltage, and power dissipation of a typical MOSFET device are influenced by the layout, dimensions, and materials etc. Industry design practice has sought to keep the on-resistance of the MOSFET as low as possible to lower conducting power loss and increase current densities. For example, in vertical power MOSFET devices, the on-resistance is composed of several resistances such as channel resistance, drift region (epitaxial layer) resistance, and substrate resistance. The on-resistance of such a vertical power MOSFET device (as well as other MOSFET devices) is directly influenced by the type and dimensions of materials used to form the drain to source conduction path. Therefore, for a vertical power device, such as a power MOSFET, the substrate is a critical performance element.

Even though conventional techniques have been widely used for making vertical power devices, there are limitations associated with these conventional techniques. Some of these limitations are discussed in detail below.

Thus, there is a need for improved techniques for making vertical devices having desirable device properties while maintaining a simple manufacturing process.

BRIEF SUMMARY OF THE INVENTION

In accordance with embodiments of the present invention, various techniques are described for enhancing carrier mobility in semiconductor devices having a strained semiconductor channel region over a heterostructure having at least two different semiconductor materials. Moreover, a thin heavily doped drain region is disposed on a supportive metal substrate to reduced substrate resistance. In a specific embodiment, the strained channel region is formed in a silicon layer on a relaxed silicon-germanium (SiGe) heterostructure. The lattice mismatch causes the channel region to be strained and provide higher carrier mobility. Additionally, a method is provided for forming a relaxed SiGe layer using a graded concentration structure.

The methods of forming high mobility channel regions and thin substrate having a thick supportive metal according to the present invention can be applied to the process flow of a variety of different power MOSFET processes. In an embodiment, this process can be used in the manufacture of a trench MOSFET. Alternatively, the processes can be used in forming other trench FET structure such as a shielded gate FET.

According to an embodiment of the present invention, a field effect transistor device having a strained semiconductor channel region overlying a heterostructure semiconductor on a metal substrate includes a first semiconductor layer overlying a first metal layer. The first semiconductor layer has a first semiconductor material and a second semiconductor material in a relaxed heterostructure and is heavily doped. A second semiconductor layer overlies the first semiconductor layer and has a first semiconductor material and a second semiconductor material in a relaxed heterostructure. The second semiconductor layer is more lightly doped than the first semiconductor layer. A trench extends into the second semiconductor layer and a channel region has a strained layer of the first semiconductor material adjacent a trench sidewall. The strained channel region provides enhanced carrier mobility and improves performance of the field effect transistor.

According to another embodiment of the present invention, a method for forming a semiconductor device having a strained semiconductor channel region overlying a heterostructure semiconductor on a metal substrate can be described as follows. A layer of graded heterostructure is formed overlying a semiconductor substrate. The semiconductor substrate includes a first semiconductor material, and the layer of graded heterostructure includes the first semiconductor material and a second semiconductor material. In the embodiment described above, the semiconductor substrate can be a silicon substrate, and the graded layer can be a SiGe layer that has gradually increasing concentration of Ge. However, other suitable combinations of semiconductor materials can also be used. A first relaxed heterostructure is formed overlying the layer of graded heterostructure. The first relaxed heterostructure includes the first semiconductor material and the second semiconductor material and is heavily doped and characterized by a first conductivity. In the example described above, the first relaxed heterostructure can be a heavily doped SiGe layer. The method continues with forming a second relaxed heterostructure overlying the layer of the first relaxed heterostructure. The second relaxed heterostructure includes the first semiconductor material and the second semiconductor material and has a second conductivity that is lower than the first conductivity. In the above example, the second relaxed heterostructure can be lightly doped epitaxial SiGe layer.

In the above method, various components of a field effect transistor are formed. In one embodiment, the field effect transistor has a trench extending into the second relaxed heterostructure and a channel region that includes a layer of strained first semiconductor material lining a sidewall of the trench. A top conductor layer and a bottom conductor layer are formed to provide contacts for the field effect transistor. In examples described above, the field effect transistor device can be a trench gate MOSFET or a shielded gate MOSFET having a strained silicon channel region formed on the relaxed SiGe trench sidewall. In such devices, a current conduction in the channel region is characterized by an enhanced carrier mobility in the strained semiconductor layer.

The following detailed description and the accompanying drawings provide a better understanding of the nature and advantage of the present invention.

DETAILED DESCRIPTION OF THE INVENTION

Figure 1:
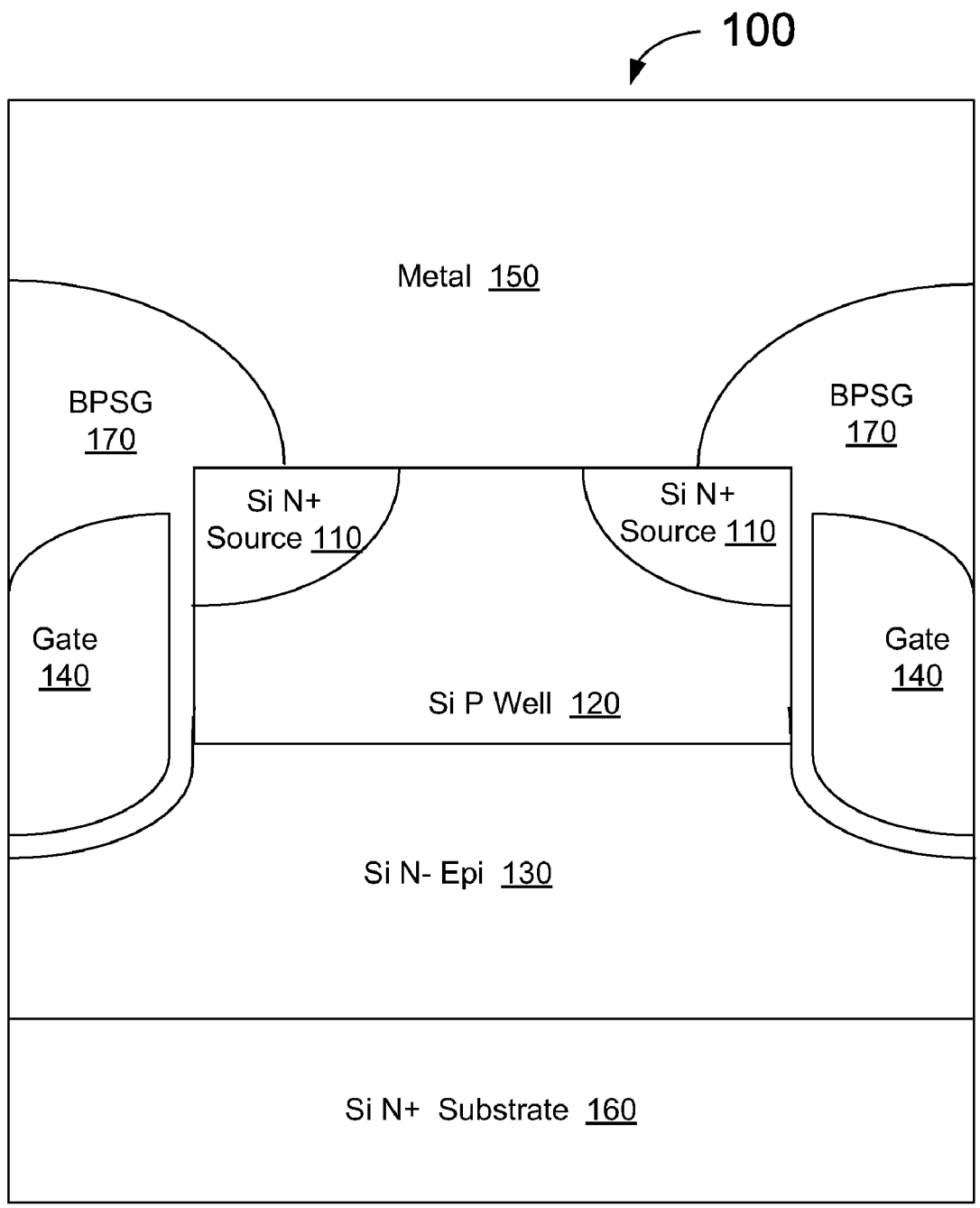
FIG. 1 is a simplified cross-sectional view diagram illustrating a conventional trench gate MOSFET.

FIG. 1 is a simplified cross-sectional view diagram illustrating a conventional trench gate MOSFET 100. This device is built using a silicon substrate and includes n-type source regions 110, a body formed by p-well 120, n-type drain region 130, substrate 160, gates 140, and metal contact 150. As described below, there are device performance limitations associated with the trench MOSFET of FIG. 1.

In a vertical device, such as the trench gate power MOSFET device of FIG. 1, the device performance is limited by channel impedance and drain impedance, among other factors. That is, it is desirable to reduce the on-resistance ($R_{DSon}$) and the drain resistance of MOS-gate power transistors devices, particularly in low voltage applications. For example, in the application of synchronous DC-DC converter, the gate driver for a p-channel MOSFET consumes less power than a driver for an n-channel device. Thus, it is very desirable to use p-channel devices for the high side driver instead of n-channel devices.

But the $R_{DSon}$ for a p-channel device is much higher than a similar n-channel MOSFET, and this limits its application to only small current region. In low voltage applications, channel resistance dominates the device $R_{DSon}$. The channel resistance ($R_{ch}$) is:

$$R_{ch} = \frac{L}{Z\mu_p C_{ox}(V_G - V_T)}$$

where L is the channel length, Z is the channel width, $C_{ox}$ is the gate oxide capacitance per unit area, $V_G$ is the gate voltage and $V_T$ is the threshold voltage. To reduce channel resistance, it is desired to shrink channel length, gate oxide thickness, and lower the threshold voltage. Due to the process limitation or sub-threshold issue, these approaches are limited.

In a conventional vertical power device, drain resistance also plays an important role in limiting the device performance. A conventional device often has a relatively thick semiconductor substrate (e.g., on the order of hundreds μm) and sometimes a thin metal contact layer. The long conduction path through substrate can further degrade the performance of power devices.

To improve the performance of vertical power devices, embodiments of the present invention provide various techniques for forming semiconductor devices having a strained semiconductor channel region for higher carrier mobility and reduced channel impedance. Moreover, a thin heavily doped drain region is disposed on a supportive metal substrate to reduced substrate resistance. In one specific embodiment, the strained channel region is formed in a silicon layer on a relaxed silicon-germanium (SiGe). The lattice mismatch causes the channel region to be strained and provide higher carrier mobility. Additionally, a method is provided for forming a relaxed SiGe layer using a graded concentration structure.

The methods of forming high mobility channel regions and thin substrate having a thick supportive metal according to the present invention can be applied to the process flow of a variety of different power MOSFET processes. In an embodiment, this process can be used in the manufacture of a trench MOSFET. Alternatively, the processes can be used in forming other trench FET structure such as a shielded gate FET. Examples of a trench gate MOSFET and a shielded agate MOSFET are provided below.

Figure 2:
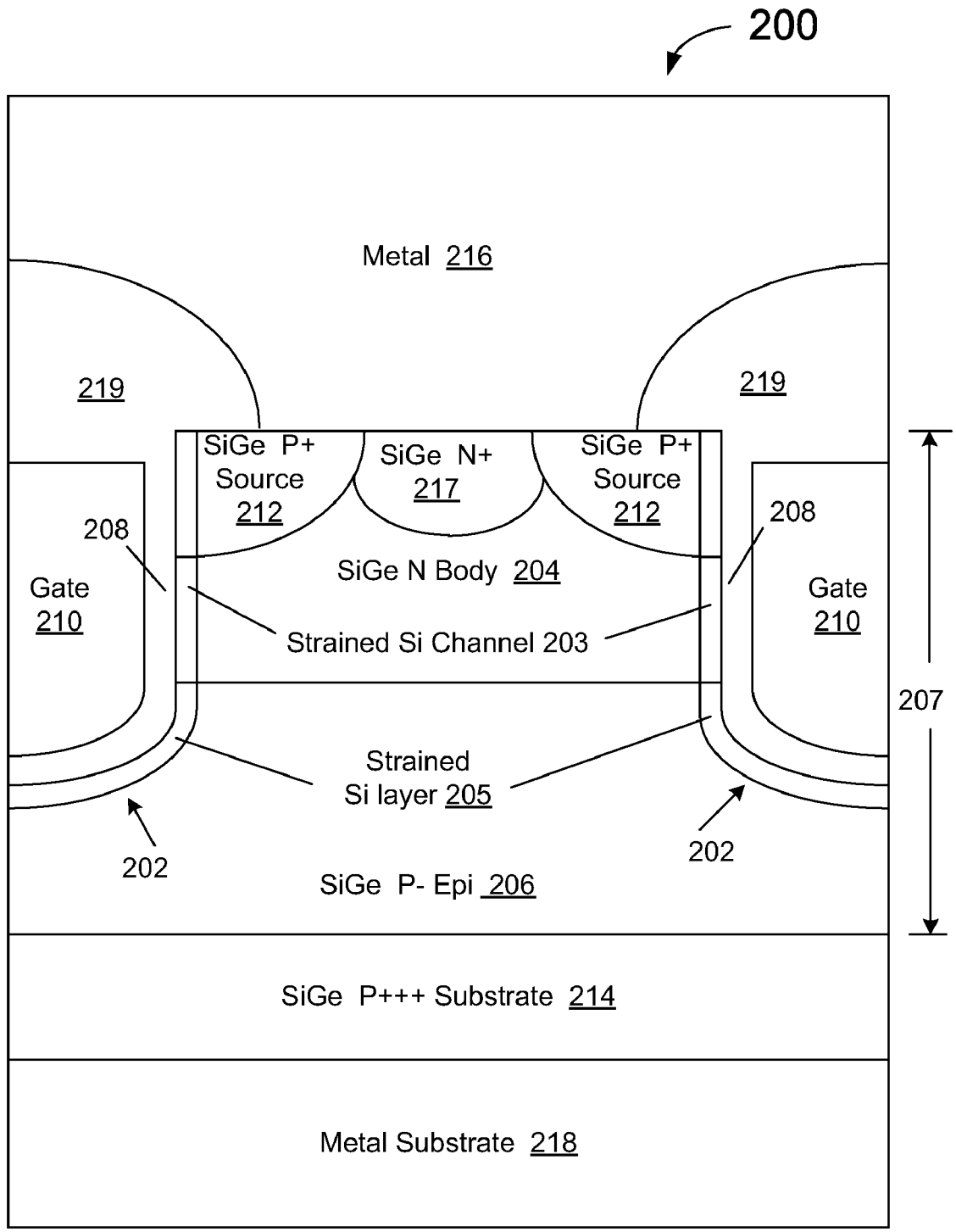
FIG. 2 is a simplified cross-sectional view diagram illustrating a trench gate MOSFET having a strained semiconductor channel region and a heavily doped drain region on a metal substrate according to an embodiment of the present invention.

FIG. 2 is a simplified cross-sectional view diagram illustrating a trench gate MOSFET having a strained semiconductor channel region and a heavily doped drain region on a metal substrate according to an embodiment of the present invention. As shown in FIG. 2, MOSFET 200 is formed in a relaxed silicon-germanium (SiGe) heterostructure substrate and a channel region formed in a strained silicon layer. MOSFET 200 includes gate electrodes 210 that are formed inside trenches 202. Trenches 202 extend from the top surface of a SiGe N– well body region (or well region) 204 terminating in a SiGe p-type drift or epitaxial region 206. In one embodiment, trenches 202 are lined with strained silicon layers 205. Additionally, gate dielectric layers 208 overlie the strained silicon layers 205. MOSFET 200 also includes conductive material 210, such as doped polysilicon, as the gate electrode. P-type source regions 212 are formed inside the N– well body region 204 adjacent trenches 202. MOSFET 200 includes N+ heavy body regions 217 formed inside the N– well body region 204. A drain terminal for MOSFET 200 includes metal substrate 218 disposed on a back surface of p-type heavily doped SiGe layer 214. The epitaxial layer 206 and body region 204 form a semiconductor structure layer 207 disposed on the heavily doped p-type SiGe layer 214. A source metal 216 provides contact to the source regions 212 and the heavy body region 217, whereas dielectric regions 219 isolate metal region 216 from gate electrodes 210.

As depicted in FIG. 2, p-type heavily doped layer 214, p-type drift or epitaxial region 206, and n-well body region 204 are all formed in relaxed silicon-germanium (SiGe) heterostructures. The lattice constant of the relaxed $Si_{1-x}Ge_x$ heterostructure is substantially larger than that of the silicon layer. It is known that when a thin Si layer is grown pseudomorphically on a relaxed SiGe alloy buffer, the lattice mismatch creates biaxial tensile stress, which enhances the transport properties of the Si layer due to the altered band structure and electronic properties compared to unstrained-Si. In the conduction band, tensile strain splits six silicon conduction band minimum into two groups: 2-fold valleys with lower energy and 4-fold valleys with higher energy. Electron effective mass and inter-valley scattering are significantly reduced. Theoretically, maximum electron enhancement factor is about 1.8 and it saturates around Ge content of 15%. Maximum hole enhancement factor is about 2.4 and saturates around Ge content of 30%. However, experimental values can vary.

In FIG. 2, due to lattice mismatch of the silicon layer and the relaxed SiGe heterostructure, the silicon layer 205 is strained. Consequently, carrier mobility is substantially enhanced in the channel regions 203 formed in strained silicon layers 205. Accordingly, current conduction from the top metal layer 216 to the bottom metal layer 218 along the strained silicon channel regions 203 are increase due to higher carrier mobility and lower channel impedance. As a result, device performance of trench gate MOSFET 200 is improved by the enhanced carrier mobility in the strained silicon channel region. Furthermore, the mobility for both holes and electrons are enhanced in the strained silicon channel region.

The SiGe heterostructures of FIG. 2 provide additionally benefits. For example, the diffusion of common dopants, such as boron and phosphorus, is suppressed in SiGe heterostructures. The reduced dopant diffusion can enable tighter process control in device junction formation. As a result, the thickness of the epi layers can be lowered, and the drift region resistance can be lowered, leading to improved device performance.

Moreover, the heavily doped SiGe on metal structure of FIG. 2 further reduces the device on-resistance by reducing the resistance of the substrate. In FIG. 2, the heavily doped SiGe substrate has a thickness of about 1-2 µm in a specific embodiment. In an embodiment, the MOSFET structure, excluding the metal substrate 218 can have a thickness of approximately 3-10 µm. To provide support for such a thin device structure, the metal substrate 218 in embodiments of the present invention has sufficient thickness and strength. For example, in a specific embodiment, metal substrate 218 can be a copper layer and can have a thickness of approximately 30-100 µm. Other conductors, such as aluminum, can also be used. Additionally, the thick metal substrate also significantly improves heat dissipation of power MOSFEFs due to better thermal conductivity of the metal.

Thus, the features embodied in trench gate MOSFET 200 provide enhanced carrier mobility and lower drain and substrate resistance, compared to conventional p-type trench MOSFETs.

It is noted that FIG. 2, as with the other included figures, is shown for illustrative purposes, and does not limit either the possible embodiments of the present invention or the claims. Also, while in this and the other figures a p-channel transistor is shown, embodiments of the present invention can similarly be used to improve n-channel devices. Features shown in other figures may also be included in this figure. It is to be understood, however, that the techniques of the present invention apply to both discrete devices as well as integrated circuits using any processing technology. As with all other figures described herein, the relative dimensions and sizes of various elements and components depicted in the figures do not exactly reflect actual dimensions and are for illustrative purposes only.

Figure 3:
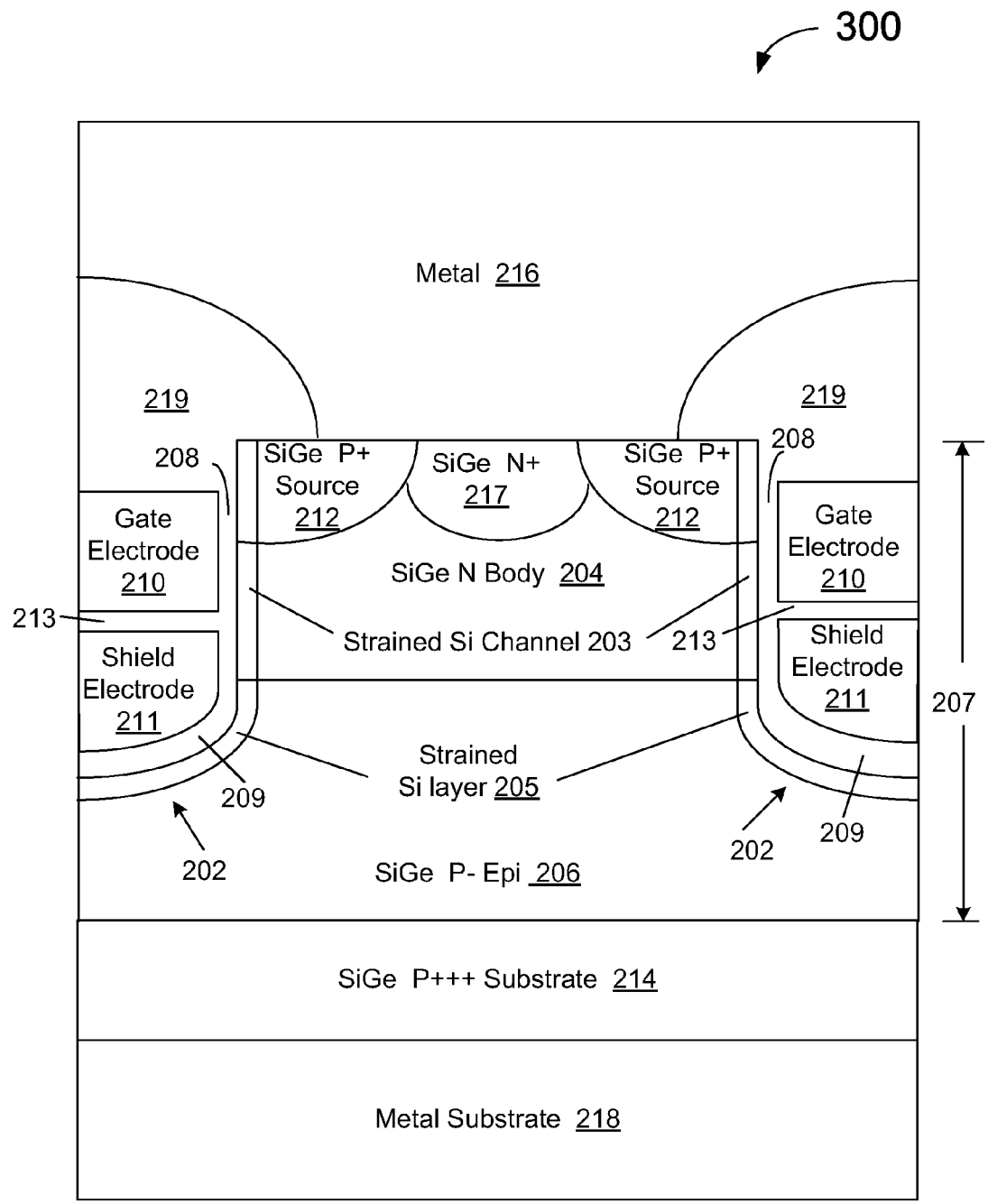
FIG. 3 is a simplified cross-sectional view diagram illustrating a shielded gate MOSFET having a strained semiconductor channel region and a heavily doped drain region on a metal substrate according to an embodiment of the present invention.

FIG. 3 is a simplified cross-sectional view diagram illustrating a shielded gate MOSFET having a strained semiconductor channel region and a heavily doped drain region on a metal substrate according to an embodiment of the present invention. As shown, MOSFET 300 in FIG. 3 is formed in a silicon-germanium (SiGe) heterostructure substrate and includes similar features as MOSFET 200 in FIG. 2. For example, p-type heavily doped layer 214, p-type drift or epitaxial region 206, and n-well body region 204 are all formed in relaxed silicon-germanium (SiGe) heterostructures. Moreover, trenches 202 are lined with strained silicon layers 205, and carrier mobilities are substantially enhanced in the channel regions 203 formed in the strained silicon layers 205.

MOSFET 300 in FIG. 3 includes shielded gate electrodes 211, made of conductive material such as doped polysilicon, that are insulated from lower portions of the trenches 202 with shield dielectric layers 209. Inter-electrode dielectrics 213 overlie shield gate electrodes 211 and insulate gate electrodes 210 from shield electrodes 211. In an embodiment, shield gate 211 can be biased to different potentials, e.g., ground potential, to reduce the gate/drain coupling capacitance.

Similar to device 200 of FIG. 2, shielded gate trench MOSFET 300 in FIG. 3 includes strained silicon channel regions 203 built over relaxed SiGe heterostructures. Accordingly, MOSFET 300 also provides similar benefits, such as enhanced carrier mobility, reduced substrate resistance, improved heat conductivity, etc. Moreover, even though FIG. 3 illustrates a p-channel shielded gate MOSFET, embodiments of the present invention can similarly be used to improve n-channel devices.

Additionally, it is to be understood, that the principle techniques of the present invention are not limited to silicon or silicon-germanium heterostructures. Embodiments of the present invention provide a field effect transistor device having a strained semiconductor channel region overlying a heterostructure-semiconductor on a metal substrate. In an embodiment, the device includes a first metal layer, and a first semiconductor layer overlying the first metal layer. The first semiconductor layer has a first semiconductor material and a second semiconductor material in a relaxed heterostructure. The first semiconductor layer is heavily doped and characterized by a first conductivity. The second semiconductor layer also has a first semiconductor material and a second semiconductor material in a relaxed heterostructure. The second semiconductor region has a second conductivity that is lower than the first conductivity. The device also has a trench extending into the second semiconductor layer. A channel region has a layer of first semiconductor material adjacent a trench sidewall. Due to lattice mismatch between the channel region and the relaxed heterostructure region, carrier mobility is enhanced. Furthermore, a second metal layer overlies the second semiconductor layer. In this device, a current conduction in the channel region is characterized by enhanced carrier mobility in the strained semiconductor channel region. In an embodiment, the substrate resistance is reduced due to the thin and heavily doped first semiconductor layer and the thick first metal layer that also functions as a support layer.

Figure 4A:
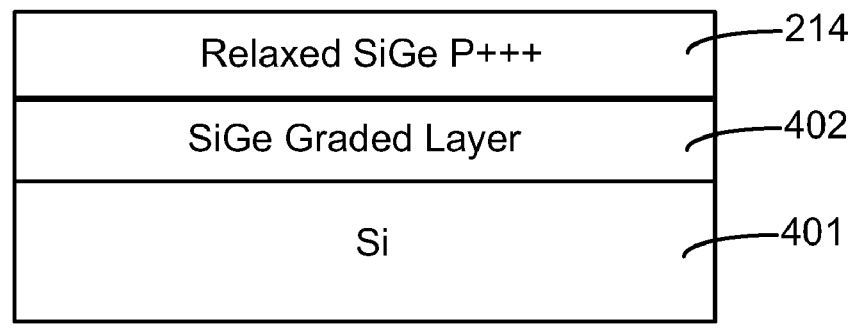
FIGS. 4A-4G are simplified cross-sectional view diagrams illustrating a method for forming a vertical semiconductor device having a heavily doped drain region on a metal substrate according to an embodiment of the present invention.

FIGS. 4A-4G are simplified cross-sectional view diagrams illustrating a method for forming a vertical semiconductor device having a heavily doped drain region on a metal substrate according to an embodiment of the present invention. In FIG. 4A, a SiGe graded layer 402 is formed over a silicon substrate 401, and a relaxed SiGe layer 214 is formed over SiGe graded layer 402. The SiGe graded layer 402 can be formed using known techniques such as chemical vapor deposition in ultra high vacuum to form $Si_{1-x}Ge_x$ layers having increasing germanium (Ge) content. In a specific embodiment, the Ge content is increased from zero to 20% or 30%. For example, the concentration can be increased by steps of 2-3% for each 1 or 2 μm of thickness until the Ge concentration in the graded layer reaches, e.g., 20%. Subsequently, a heavily doped relaxed SiGe layer 214 is formed over SiGe graded layer 402 using similar techniques. In an embodiment the relaxed SiGe layer 214 can have a Ge content of approximately 25%, i.e., $Si_{0.75}Ge_{0.25}$. In FIG. 4A, the relaxed SiGe layer 214 is heavily boron doped, e.g., with concentration on the order of $1\times10^{19}$ or $1\times10^{20}$ cm$^{-3}$. The heavy doping can be achieved using in-situ doping or ion implantation techniques.

Figure 4B:
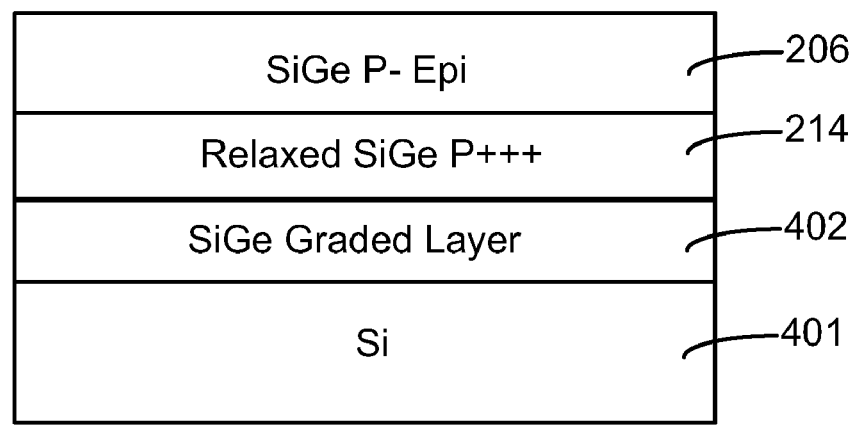
Figure 4C:
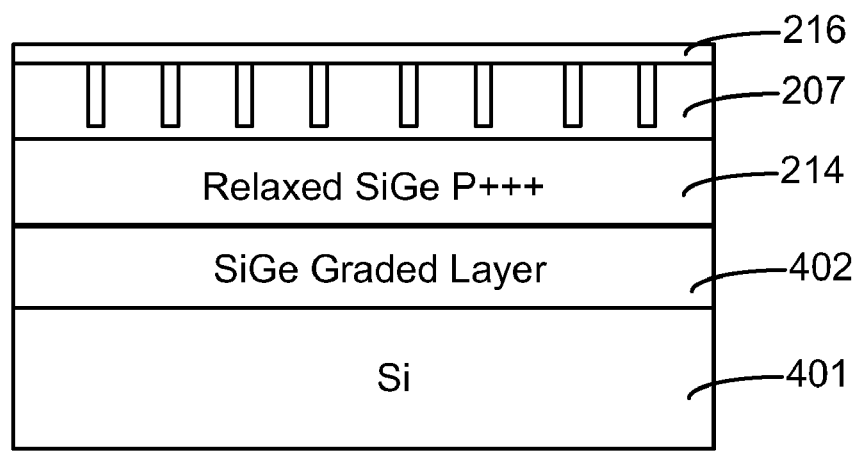

In FIG. 4B, a lightly doped relaxed SiGe layer 206 is epitaxially grown on the relaxed heavily doped SiGe layer 214. In an embodiment, layer 214 may have a thickness of about 1 μm to 2 μm, and layer 206 may have a thickness of 1 μm to 10 μm. Subsequently, the structure in FIG. 4B can undergo a device fabrication process to form a device structure, e.g., a vertical trench MOSFET such as shown in FIG. 2 in and over the relaxed SiGe epitaxial layer 206. In FIG. 4C, the layer that includes this device structure is show as 207. A top metal layer 216 is then formed over the device structure 207.

It is noted that the structure represented by 207 and 216 can be any suitable device structures. For example, structure 207 in FIG. 4C can represent the trench gate MOSFET structure layer 207 in FIG. 2 or the shielded gate MOSFET structure layer 207 in FIG. 3.

Figure 4D:
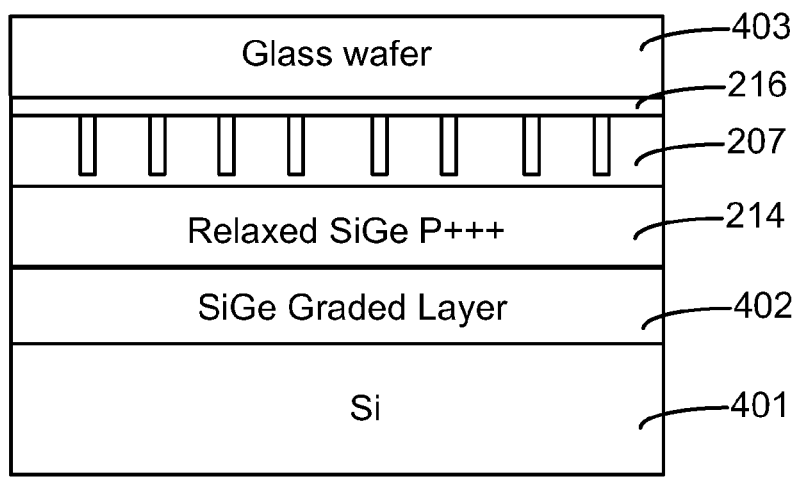

To facilitate the removal of the silicon substrate 401 and SiGe graded layer 402, the device structure of FIG. 4C is bonded to a support substrate 403, e.g., a glass wafer as shown in FIG. 4D.

Figure 4E:
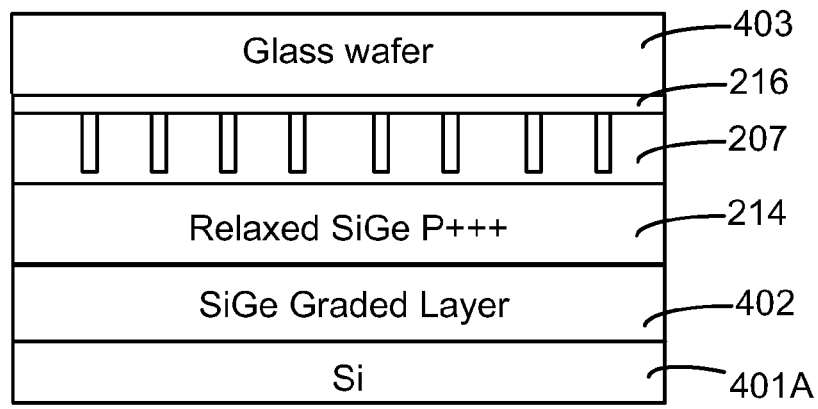

In FIG. 4E, the majority (e.g. 90%) of silicon substrate 401 is removed through mechanical grinding and acid etching. In an embodiment, the silicon substrate can be removed using a wet etching process including potassium hydroxide (KOH) or ethylenediamine pyrocatechol (EDP). The remaining portion of substrate, 401A, and a substantial portion of SiGe graded layer 402 can be removed by an etchant such as tetramethylammonium hydroxide (TMAH). Due to the high etch selectivity of TMAH, the etching substantially stops when the Ge content of SiGe reaches about 20%. That is, a $Si_{0.80}Ge_{0.20}$ layer can function as an etch stop for TMAH etching. This property can be used advantageously for better process control.

Figure 4F:
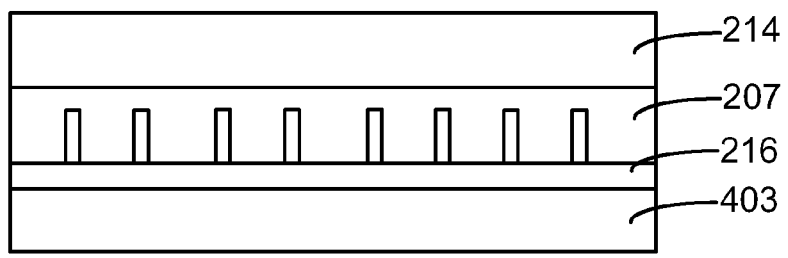
Figure 4G:
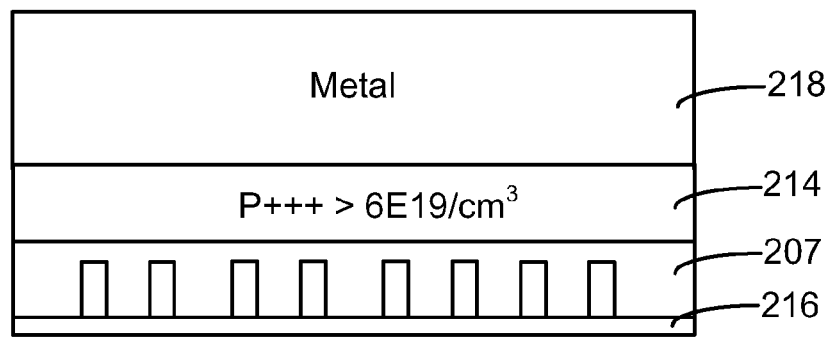

FIG. 4F shows the device structure after the removal of the remaining Si layer 401A and the graded SiGe layer 402. In FIG. 4G, backside metal 218 is formed to contact heavily doped drain layer 214. Using the metal substrate 218 as support, the glass substrate 403 is removed, resulting in the device structure shown in FIG. 4G.

As described above, FIGS. 4A-4G are simplified diagrams illustrating a method for forming vertical devices including a heavily doped relaxed semiconductor heterostructure on a metal substrate. As shown, the method includes forming a layer of graded heterostructure on a semiconductor substrate. The thickness of the graded layer is sufficient to allow a top layer to be relaxed. Then a heavily doped relaxed heterostructure having the desired composition is formed over the graded layer. After a MOSFET device is built in an over the relaxed heterostructure layer, the graded layer is removed using a wafer transfer method described above.

A field effect transistor having a strained channel region can be built using the relaxed heterostructure describe above. According to an embodiment of the present invention, a method for forming a semiconductor device having a strained semiconductor channel region overlying a heterostructure semiconductor on a metal substrate can be described as follows. A layer of graded heterostructure is formed overlying a semiconductor substrate. The semiconductor substrate includes a first semiconductor material, and the layer of graded heterostructure includes the first semiconductor material and a second semiconductor material. In the embodiment described above, the semiconductor substrate can be a silicon substrate, and the graded layer can be a SiGe layer that has gradually increasing concentration of Ge. However, other suitable combinations of semiconductor materials can also be used. A first relaxed heterostructure is formed overlying the layer of graded heterostructure. The first relaxed heterostructure includes the first semiconductor material and the second semiconductor material and is heavily doped and characterized by a first conductivity. In the example described above, the first relaxed heterostructure can be a heavily doped SiGe layer. The method continues with forming a second relaxed heterostructure overlying the layer of the first relaxed heterostructure. The second relaxed heterostructure includes the first semiconductor material and the second semiconductor material and has a second conductivity that is lower than the first conductivity. In the above example, the second relaxed heterostructure can be lightly doped epitaxial SiGe layer.

In the above method, various components of a field effect transistor are formed. In one embodiment, the field effect transistor has a trench extending into the second relaxed heterostructure and a channel region that includes a layer of strained first semiconductor material lining a sidewall of the trench. A top conductor layer and a bottom conductor layer are formed to provide contacts for the field effect transistor. In examples described above, the field effect transistor device can be a trench gate MOSFET or a shielded gate MOSFET having a strained silicon channel region formed on the relaxed SiGe trench sidewall. In such devices, a current conduction in the channel region is characterized by an enhanced carrier mobility in the strained semiconductor layer.

Figure 5A:
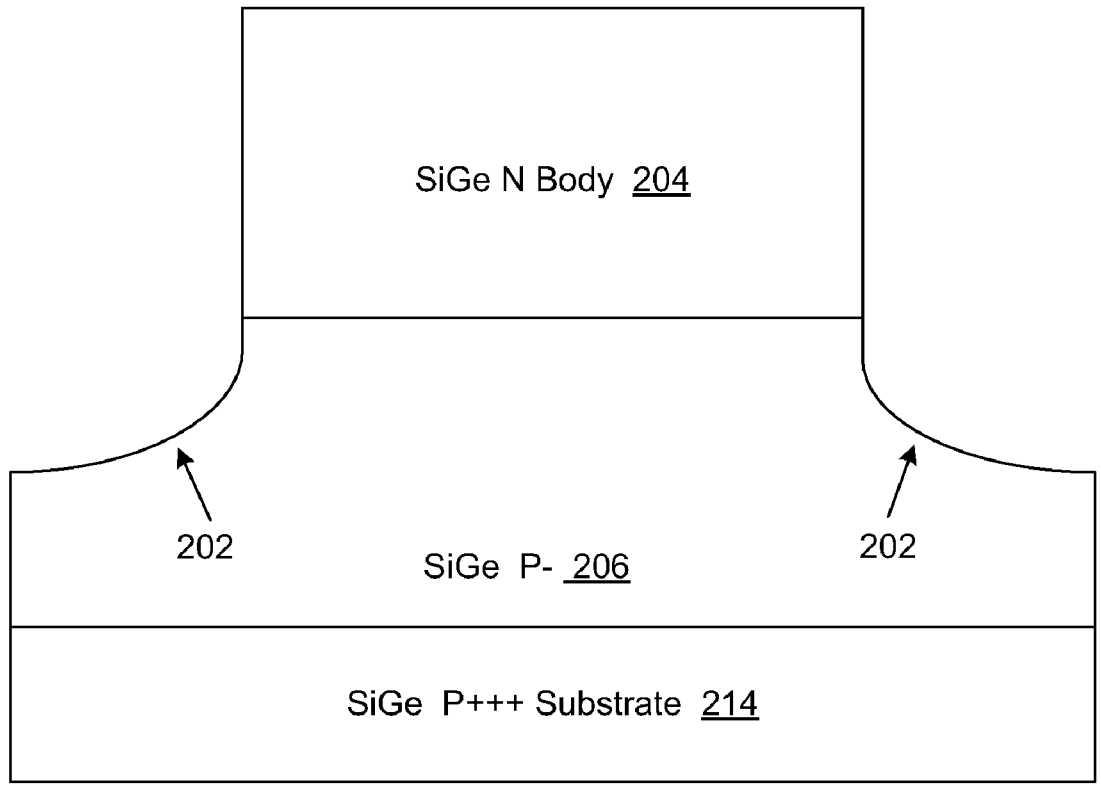
FIGS. 5A-5D are simplified cross-sectional view diagrams illustrating a method for forming a trench gate MOSFET device having a strained semiconductor channel region and a heavily doped drain region according to an embodiment of the present invention.

FIGS. 5A-5D are simplified cross-sectional view diagrams illustrating a method for forming a trench gate MOSFET device having a strained semiconductor channel region and a heavily doped drain region according to an embodiment of the present invention; in accordance with an embodiment of the invention. In FIG. 5A, a relaxed p-type SiGe layer 206 is formed on a heavily doped relaxed p-type SiGe layer 214. For example, layers 214 and 206 can be formed using the method described above in connection with FIGS. 4A and 4B. As shown in FIG. 4B, at this stage of device processing, relaxed SiGe layer 214 overlies a SiGe graded layer 402 which, in turn, overlies a silicon substrate 401. For simplicity, layers 401 and 402 are not shown in FIG. 5A-5C. An n-type body region 204 is formed in SiGe layer 206. The dopants in the above layers can be introduced in-situ during the layer forming process or by implanting and diffusing dopants.

In FIG. 5A, a masking layer (not shown) is formed on top of body region 204 by a conventional method. The masking layer is patterned to define openings through which trenches 202 are formed. A conventional anisotropic silicon etch may be used to etch trenches extending through body region 204 and terminating below the bottom surface of body region 204.

Figure 5B:
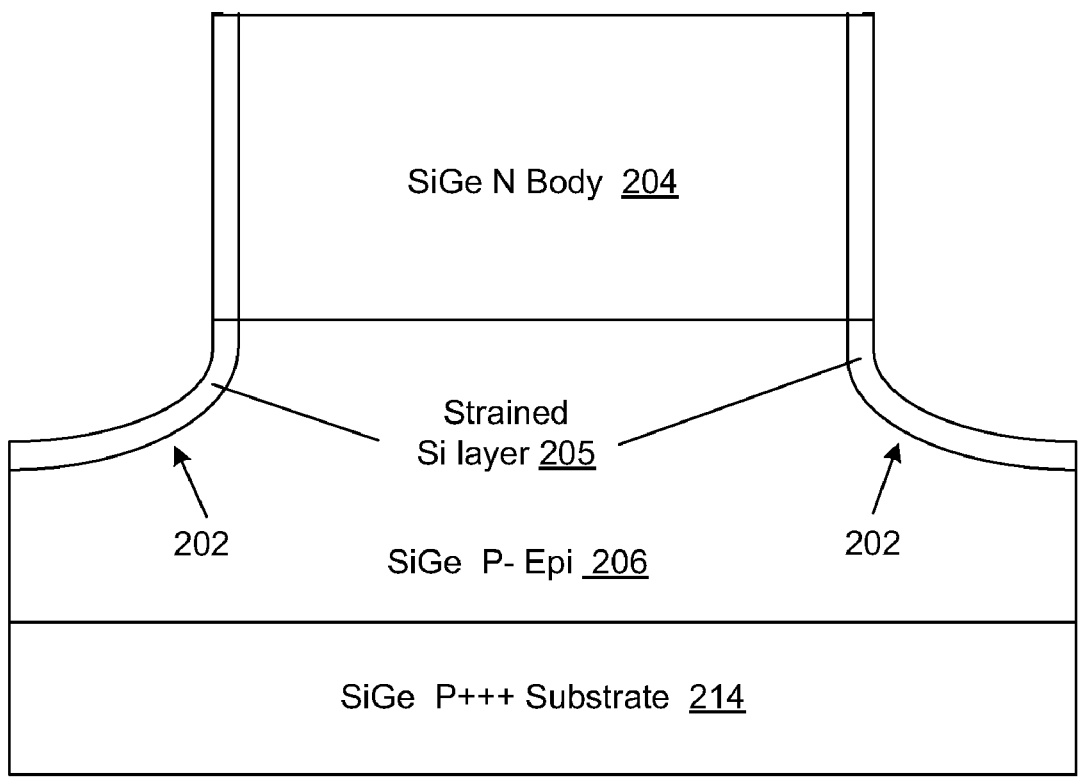

In FIG. 5B, a silicon layer 205 is epitaxially grown over relaxed silicon-germanium (SiGe) heterostructure of body region 204 and drift (epi) region 206. Silicon layer 205 is strained because the lattice constant of the relaxed $Si_{1-x}Ge_x$ heterostructure is substantially larger than that of silicon. Consequently, carrier mobility can be substantially enhanced in channel regions formed in the strained silicon layers 205.

Figure 5C:
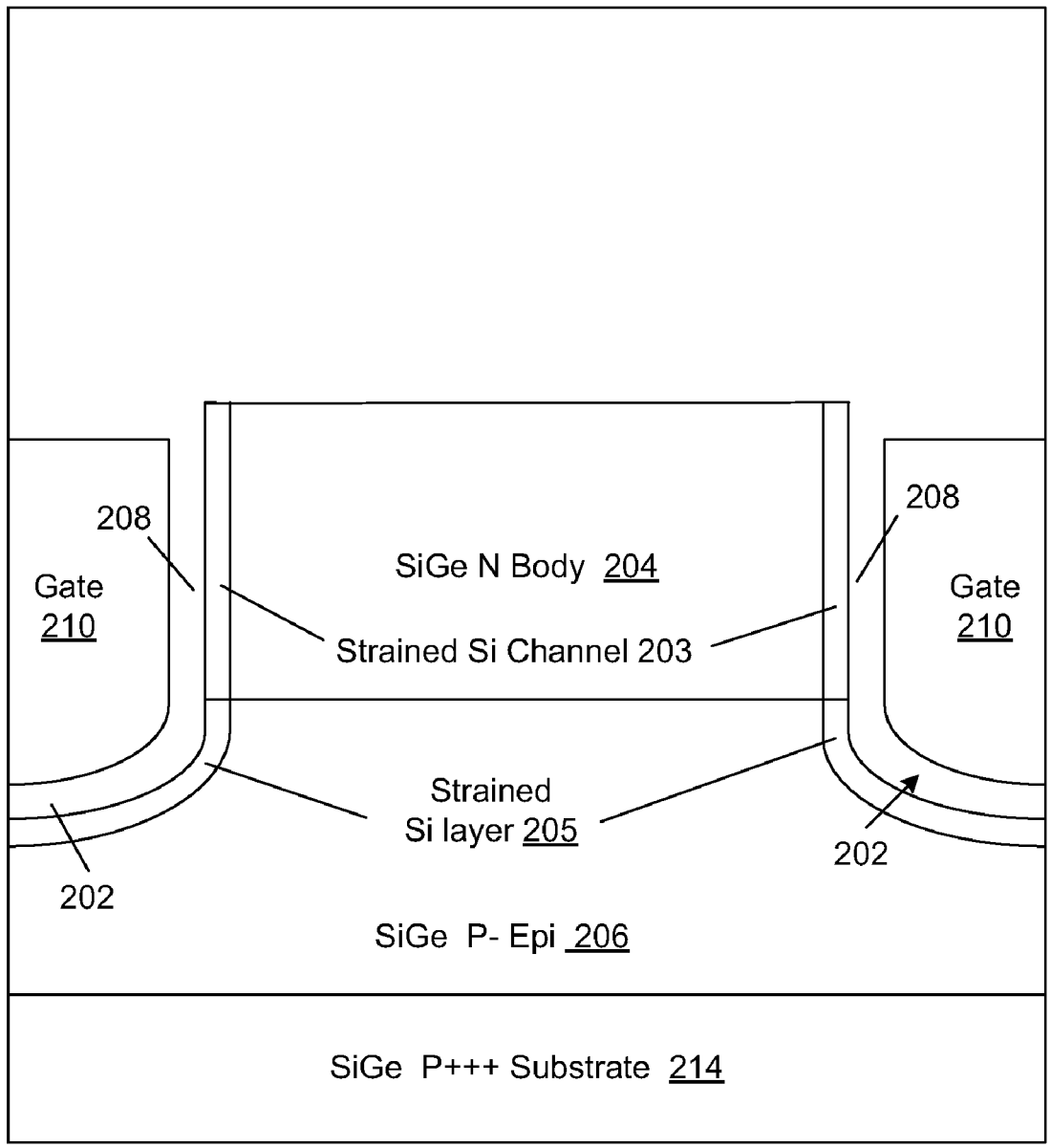

In FIG. 5C, a thin gate dielectric 208 is formed, which lines the sidewalls and bottom of trenches 202. Gate dielectric 208 may be formed by known methods. Additionally, recessed gate electrodes 210 (e.g., comprising polysilicon) is formed in trenches 202 using conventional techniques.

Figure 5D:
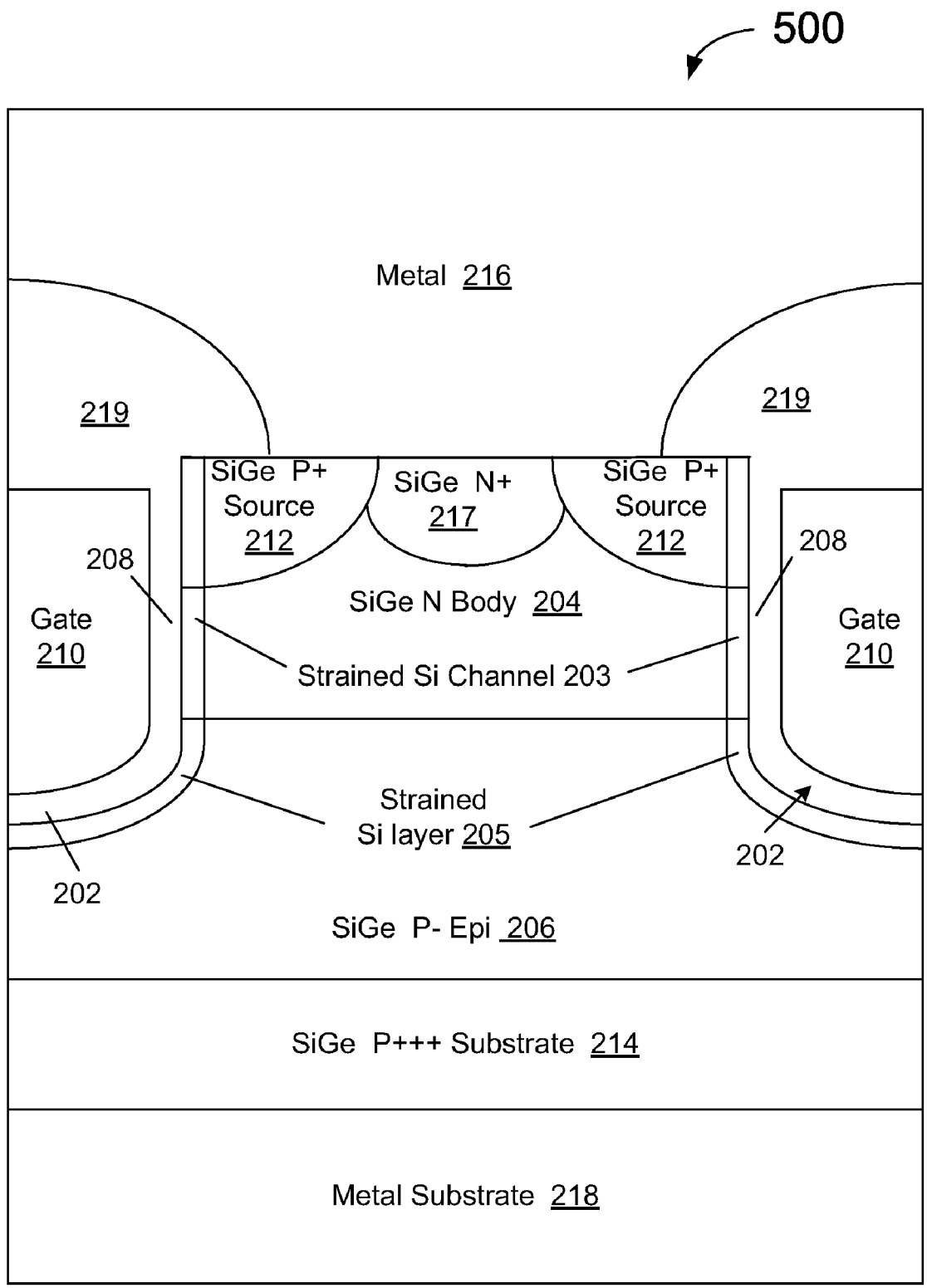

In FIG. 5D, source regions 212 and heavy body region 217 are formed using implant and diffusion techniques. The active regions of the field effect transistor are thus formed between source regions 212 and drift region 206 along the sidewalls of each trenches 202. In FIG. 5D, recessed gate electrode 210 are covered by dielectric regions 219, and source metal 216 is formed for contact with source regions 212 and heavy body region 217. Additionally, the method depicted in FIGS. 4E to 4G can be used to remove the silicon substrate and graded SiGe layer. Subsequently, metal support layer 218 is formed to function as a support layer and as a drain terminal in contact with SiGe drain region 214.

Note that the p-type trench gate device structure in FIG. 5D is similar to the device structure 200 in FIG. 2, having a thin heavily doped p-type relaxed SiGe drain layer 214 overlying the metal substrate and a strained silicon channel region 203 with enhanced carrier mobility.

Figure 6A:
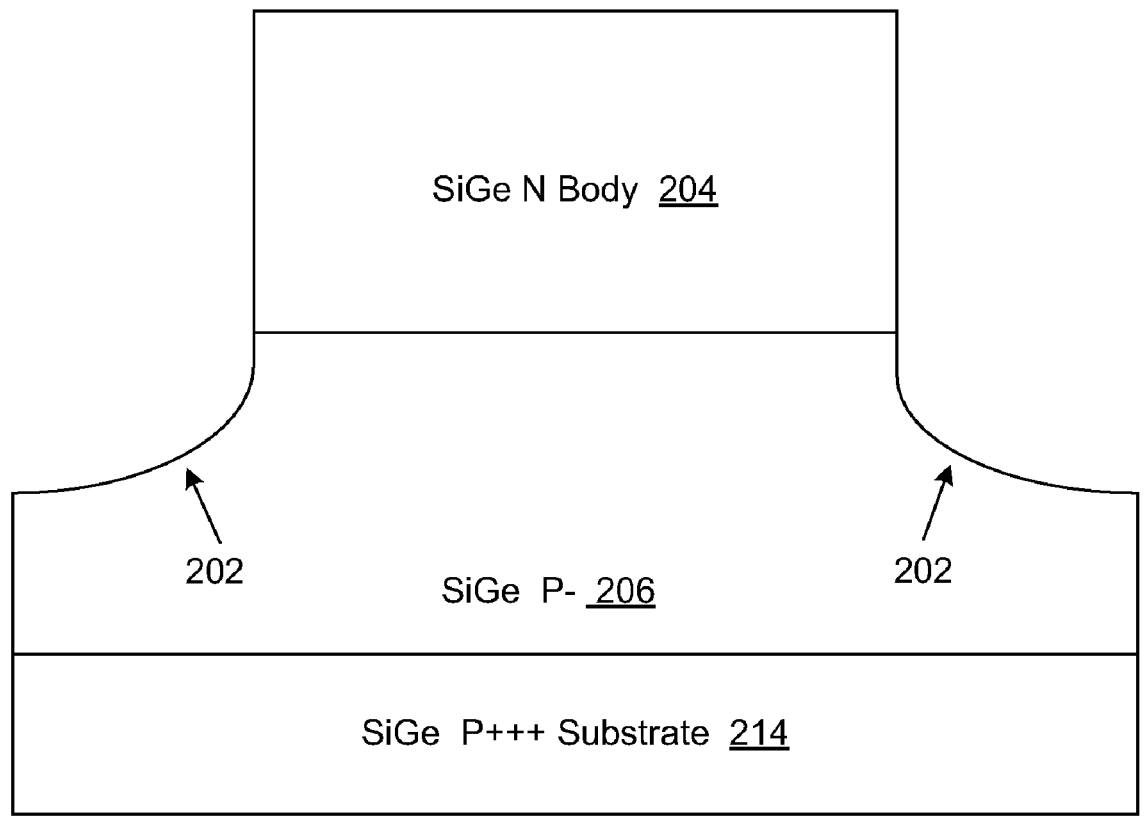
FIGS. 6A-6D are simplified cross-sectional view diagrams illustrating a method for forming a shielded gate MOSFET device having a strained semiconductor channel region and a heavily doped drain region according to an embodiment of the present invention.
Figure 6B:
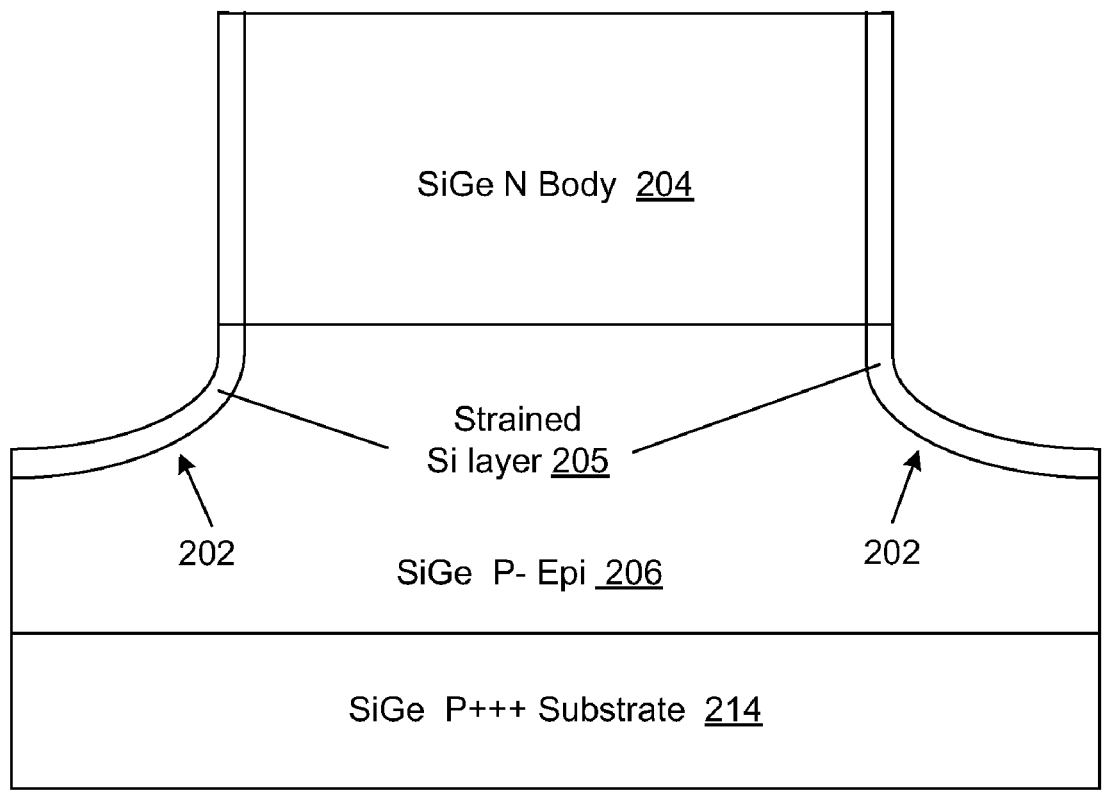

FIGS. 6A-6D are simplified cross-sectional view diagrams illustrating a method for forming a shielded gate MOSFET device having a strained semiconductor channel region and a heavily doped drain region according to an embodiment of the present invention. As shown FIGS. 6A-6B illustrate processes and device structures similar to those of FIGS. 5A-5B. In FIG. 6B, trenches 202 are formed in body region 204 and epi (drift) region 206, both of which are relaxed SiGe heterostructures. Additionally, strained silicon layers 205 are formed on the sidewalls of trenches 202.

Figure 6C:
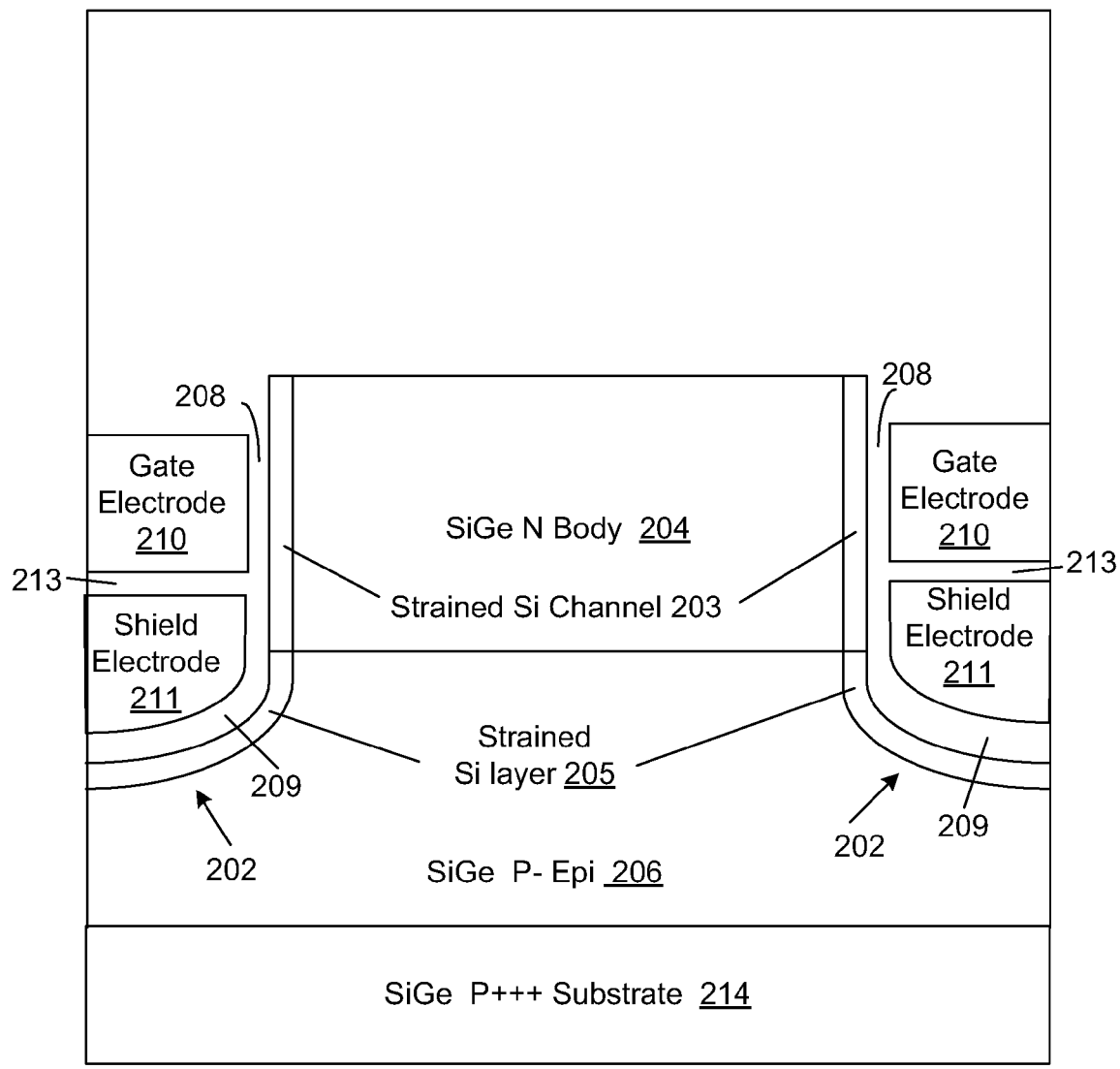

In FIG. 6C, shield dielectric 209 is formed along the sidewalls of trenches 202. Next, shield electrodes 211 are formed in a bottom portion of trenches 202 using known techniques. For example, a conductive material (e.g., comprising doped or undoped polysilicon) is first formed filling the trenches and extending over the mesa regions. The conductive material is recessed deep into trenches 202 to form shield electrodes 211 using known techniques. Then, shield dielectric is removed from along the exposed upper trench sidewalls and over mesa surfaces.

Figure 6D:
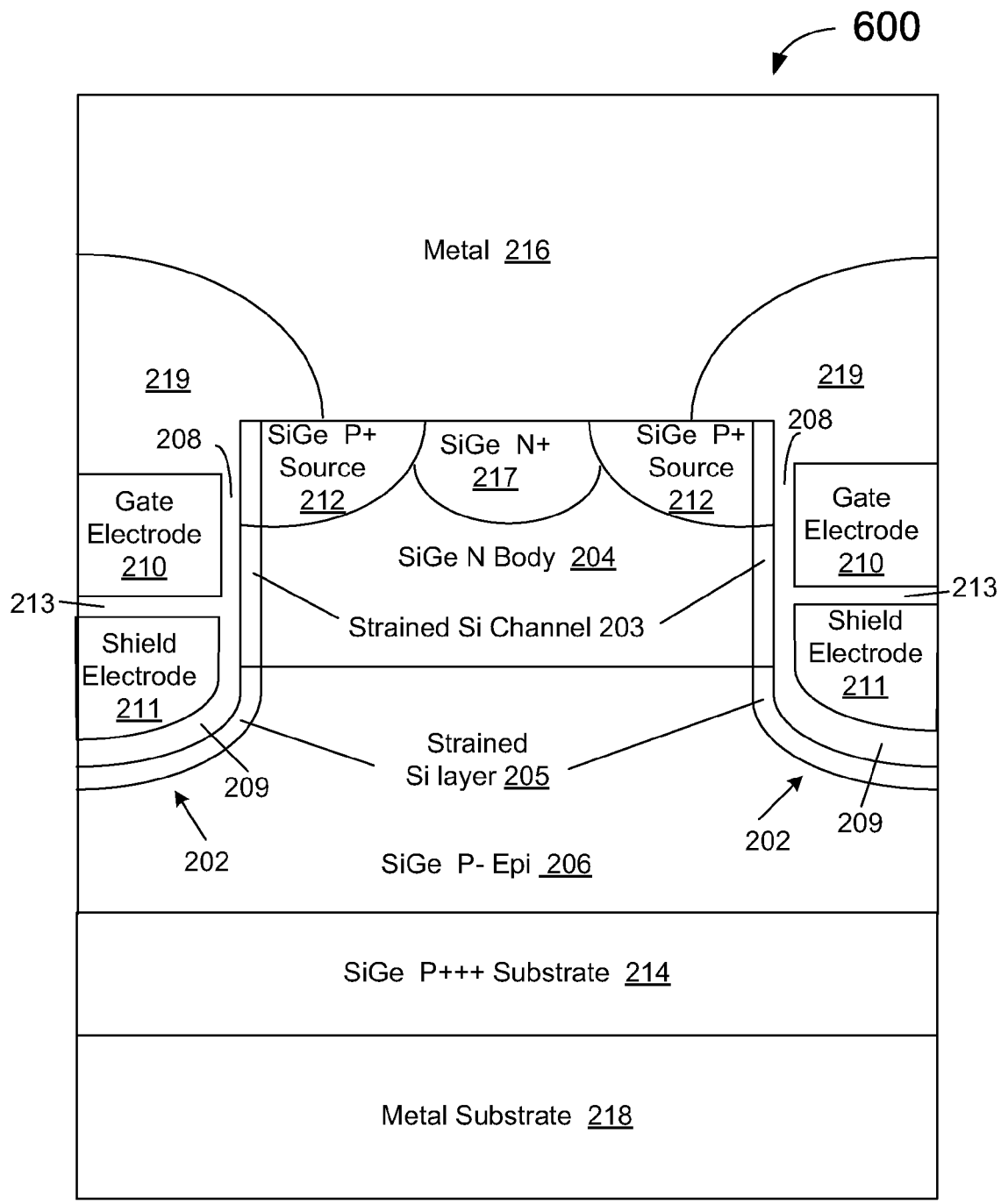

In FIG. 6C, thick inter-electrode dielectric (IED) layers 213 are formed over shield electrodes 211. Next, gate dielectric layer 208 is formed extending along the upper trench sidewalls. Recessed gate electrodes 210 are formed in trenches 202 using known techniques, e.g. polysilicon deposition and etch back. In FIG. 6D, dielectric regions 219 are formed over the gate electrodes 210. The process described in FIGS. 4E-4G can be used to remove the silicon substrate and graded SiGe layer and add metal substrate 218 to form p-type shielded gate MOSFET in FIG. 6D.

Note that the p-type shielded gate device structure in FIG. 6D is similar to the device structure 300 in FIG. 3, having a thin heavily doped p-type relaxed SiGe drain layer 214 overlying the metal substrate and a strained silicon channel region with enhanced hole mobility.

According to embodiments of the present invention, the shield electrode in a shielded gate FETs can be floating (i.e., is electrically unbiased), biased to the source potential (e.g., ground potential), or biased to the same potential as the gate electrode. The electrical contact between the gate and shield electrodes may be formed in any non-active region, such as in the termination or edge regions of the die.

While the above includes descriptions of specific embodiments of the present invention, various modifications, variations, and alternatives may be employed. For example, although silicon is given as an example of a substrate material, other materials may be used. The invention is illustrated using trench MOSFETs, but it could easily be applied to other trench-gate structures such as IGBTs by merely reversing the polarity of the substrate. Similarly, implantation is given as an example of introducing dopants, but other doping methods, such as a gas or topical dopant source may be used to provide dopants for diffusion, depending on the appropriate mask being used. The process sequences depicted are for p-channel FETs, but modifying these process sequences to form N-channel FETs would be obvious to one skilled in the art in view of this disclosure. Also, while some trenches discussed above are shown to terminate within the epitaxial layer, the trenches may alternatively extend through the epitaxial layer and terminate within the substrate region. Further, the invention is not limited to trench gate structures and may be used in forming other devices such as planar gate vertical MOSFETs, planar gate vertical IGBTs, diodes, and various types of thyristors.

Figure 7:
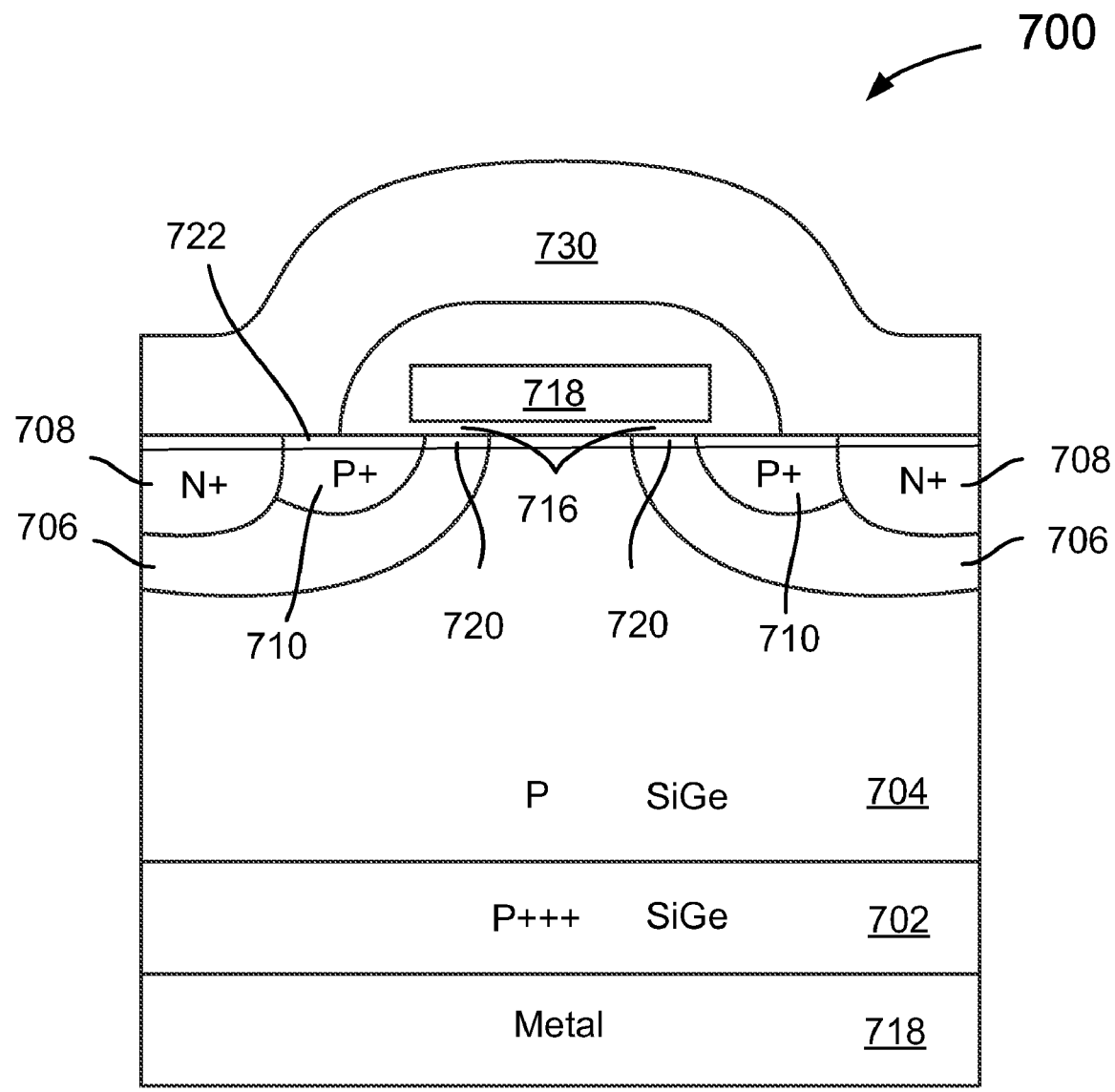
FIG. 7 is a simplified cross-sectional view diagram illustrating a lateral power MOSFET having a strained semiconductor channel region and a heavily doped drain region on a metal substrate according to an embodiment of the present invention.

Merely as an example, FIG. 7 shows a simplified cross-sectional view diagram illustrating a p-type planar power MOSFET 700 in accordance with an embodiment of the invention. The p-type planar power MOSFET 700 has conduction channels 720 in strained silicon layer 722 formed over relaxed SiGe heterostructure 704. As described above in reference to trench devices 200 of FIGS. 2 and 300 of FIG. 3, carrier mobility can be enhanced in channel regions 720, leads to better device performance of MOSFET 700.

As shown in FIG. 7, a lightly doped p-type drift region 704 extends over a thin highly doped p-type semiconductor region 702 which is disposed over a metal substrate 718. Both regions 702 and 704 are relaxed SiGe heterostructures, and region 702 is heavily doped whereas region 704 can be lightly doped. N-type body regions (or well region) 706 are located in upper portions of drift region 704. Highly doped p-type source regions 710 are located in upper parts of body regions 706, and heavy body contact regions 708 are located in body regions 706 adjacent source regions 710.

In FIG. 7, a gate 718 extends over a surface of body regions 706 and overlaps source regions 710 and drift regions 704. Gate 718 is insulated from its underlying regions by a gate dielectric 716. The portion of body region 706 directly beneath gate 718 forms the MOSFET channel regions 720. In embodiments of the invention, strained channel regions 720 provide current conduction paths where the carrier mobility is enhanced.

In FIG. 7, a source conductor 730 electrically contacts source regions 710 and heavy body regions 708. Metal substrate 718 contacts highly doped p-type SiGe heterostructure semiconductor region 702 which functions as a drain region. The source and drain conductors may be formed with metal, such as copper, aluminum, etc. In planar MOSFET 700, the top and the bottom metal layers provide external contacts for the current conduction in the device.

As noted above, it is desirable to have a thin layer of the highly doped p-type SiGe hetero structure semiconductor region 702 to reduce resistance. According to embodiments of the present invention, the SiGe drift region 704 and the underlying highly doped SiGe semiconductor region 702 can be formed using the method discussed above. Various substrate transfer processes can be used to obtain the thin layer of the highly doped p-type SiGe heterostructure semiconductor region 702, for example, the transfer process described above in connections with FIGS. 4A-4G.

While certain embodiments of the invention have been illustrated and described, those skilled in the art with access to the present teachings will recognize that the invention is not limited to these embodiments only. Numerous modifications, changes, variations, substitutions, and equivalents will be apparent to those skilled in the art. Accordingly, it is to be understood that the invention is intended to cover all variations, modifications, and equivalents within the scope of the following claims.

What is claimed is:

1. A field effect transistor device having a strained semiconductor channel region overlying a heterostructure semiconductor on a metal substrate, comprising:
   a first metal layer;
   a first semiconductor layer characterized by a thickness of approximately 3 μm or thinner and disposed directly on the first metal layer, the first semiconductor layer having a first semiconductor material and a second semiconductor material in a relaxed heterostructure, wherein the first semiconductor layer comprises no graded layers, the first semiconductor layer being heavily doped with a doping concentration of $1.0 \times 10^{19}$ cm$^{-3}$ or higher and characterized by a first conductivity;
   a second semiconductor layer disposed directly on the first semiconductor layer, the second semiconductor layer having the first semiconductor material and the second semiconductor material in a relaxed heterostructure, wherein the second semiconductor layer comprises no graded layers, the second semiconductor layer having a second conductivity that is lower than the first conductivity;
   a trench extending into the second semiconductor layer;
   a channel region having a strained layer of the first semiconductor material adjacent a trench sidewall;
   a second metal layer overlying the second semiconductor layer,
   wherein a current conduction in the channel region is characterized by an enhanced carrier mobility in the strained semiconductor layer; and
   wherein the first metal layer has sufficient thickness for supporting the field effect transistor.

2. The device of claim 1 wherein the first semiconductor layer comprises a relaxed silicon-germanium (SiGe) heterostructure.

3. The device of claim 2 wherein the first semiconductor layer comprises approximately 20-30% of Ge.

4. The device of claim 2 wherein the second semiconductor layer comprises a relaxed SiGe structure.

5. The device of claim 2 wherein the second semiconductor layer comprises approximately 20-30% of Ge.

6. The device of claim 2 wherein the channel region comprises a strained silicon layer.

7. The device of claim 1 wherein the first semiconductor layer is characterized by a doping concentration of $1 \times 10^{20}$ cm$^{-3}$ or higher.

8. The device of claim 1 wherein a thickness of the first semiconductor layer is between approximately 0.5 μm to approximately 3 μm.

9. The device of claim 1 wherein each of the first and second semiconductor layers are epitaxial layers.

10. The device of claim 1 wherein the first metal layer has a thickness of about 30-100 μm.

11. The device of claim 1 wherein the field effect transistor device comprises a trench gate MOSFET, the trench gate MOSFET further comprising:
    a gate dielectric layer lining the trench side wall adjacent the channel region;
    a gate electrode, the gate electrode being insulated from the channel region by the gate dielectric layer;
    source regions flanking each side of the gate electrode in the trench;
    a drain region including at least a portion of the heavily doped first semiconductor layer;
    a drift region overlying the drain region; and
    a body region extending over the drift region.

12. The device of claim 11 wherein the trench gate MOSFET is a p-type MOSFET.

13. The device of claim 11 wherein the trench gate MOSFET is an n-type MOSFET.

14. The device of claim 1 wherein the field effect transistor device comprises a shielded gate trench MOSFET, the shielded gate trench MOSFET further comprising:
    a shield dielectric lining sidewalls and a bottom surface of the trench;
    a shield electrode in a lower portion of the trench, the shield electrode being insulated from the second semiconductor layer by the shield dielectric;
    an inter-electrode dielectric overlying the shield electrode;
    the channel region adjacent an upper portion of trench sidewall;
    the gate dielectric layer lining the trench side wall adjacent the channel region; and
    a gate electrode in an upper portion of the trench over the inter-electrode dielectric, the gate electrode being insulated from the channel region by the gate dielectric.

15. The device of claim 14 wherein the second semiconductor layer comprises:
    source regions flanking each side of the gate electrode in the trench;
    a drain region including at least a portion of the heavily doped first semiconductor layer;
    a drift region overlying the drain region; and
    a body region extending over the drift region.

16. The device of claim 14 wherein the shielded gate MOSFET is a p-type MOSFET.

17. The device of claim 14 wherein the shielded gate MOSFET is an n-type MOSFET.

18. A field effect transistor device having a strained semiconductor channel region overlying a heterostructure semiconductor layer on a metal substrate, comprising:
    a first metal layer;
    a first semiconductor layer disposed directly on the first metal layer, the first semiconductor layer having a first semiconductor material and a second semiconductor material in a relaxed heterostructure, wherein the first semiconductor layer comprises no graded layers, the first semiconductor layer being heavily doped and characterized by a first conductivity;
    a second semiconductor layer overlying the first semiconductor layer, the second semiconductor layer having the first semiconductor material and the second semiconductor material in a relaxed heterostructure, wherein the second semiconductor layer comprises no graded layers, the second semiconductor layer having a second conductivity that is lower than the first conductivity;
    a channel region having a strained layer of the first semiconductor material overlying the second semiconductor layer;
    a gate dielectric layer overlying the channel region; and
    a gate electrode overlying the gate dielectric layer; and
    a second metal layer overlying the second semiconductor layer, wherein a current conduction in the channel region is characterized by an enhanced carrier mobility in the strained layer of the first semiconductor material.

19. The device of claim 18 wherein the first semiconductor material comprises silicon and the second semiconductor material comprises germanium.

20. The device of claim 18 wherein the channel region comprises a strained silicon layer.

21. The device of claim 18 wherein the first metal layer has sufficient thickness for supporting the field effect transistor.

22. The device of claim 18 wherein the first metal layer has a thickness of about 30-100 μm.

* * * * *